(12) United States Patent
Xu

(10) Patent No.: US 10,243,163 B2
(45) Date of Patent: Mar. 26, 2019

(54) FLEXIBLE OLED DISPLAY AND MANUFACTURING METHOD THEREOF

(71) Applicant: Wuhan China Star Optoelectronics Technology Co., Ltd., Wuhan (CN)

(72) Inventor: Chao Xu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 166 days.

(21) Appl. No.: 15/326,641

(22) PCT Filed: Dec. 13, 2016

(86) PCT No.: PCT/CN2016/109571
§ 371 (c)(1),
(2) Date: Jan. 16, 2017

(87) PCT Pub. No.: WO2018/068380
PCT Pub. Date: Apr. 19, 2018

(65) Prior Publication Data
US 2018/0337363 A1    Nov. 22, 2018

(30) Foreign Application Priority Data
Oct. 11, 2016   (CN) .......................... 2016 1 0891512

(51) Int. Cl.
*H01L 51/56*     (2006.01)
*H01L 51/52*     (2006.01)
(Continued)

(52) U.S. Cl.
CPC ...... *H01L 51/5237* (2013.01); *H01L 27/3244* (2013.01); *H01L 51/0097* (2013.01);
(Continued)

(58) Field of Classification Search
CPC ... H01L 27/32; H01L 27/3262; H01L 25/167; H01L 51/5253; H01L 27/3276; H01L 51/56; H01L 2251/5338; H01L 2227/323; H01L 27/1218; H01L 51/52; H01L 27/3244; H01L 51/5237
See application file for complete search history.

(56) References Cited

U.S. PATENT DOCUMENTS

| 9,406,905 B2 * | 8/2016 | Park ................... H01L 51/5256 |
| 2005/0116637 A1 * | 6/2005 | Yoshizawa .......... H01L 51/0097 313/512 |
| 2011/0156062 A1 * | 6/2011 | Kim .................... H01L 51/0097 257/88 |

FOREIGN PATENT DOCUMENTS

CN        105682362 A     6/2016

* cited by examiner

*Primary Examiner* — Thanh T Nguyen
(74) *Attorney, Agent, or Firm* — Leong C. Lei

(57) ABSTRACT

The invention provides a flexible circuit board and a displayer adopting the flexible circuit board. According to the flexible circuit board, installation holes for installing components run into the inner portion of the flexible circuit board. Compared with the prior art, the depth of each installation hole is deeper, so that the installation holes can accommodate the components better, the overall thickness of the flexible circuit board can be reduced, installation space is saved, space utilization rate of the product is improved, and design requirement for smaller or higher-density installation can be met.

13 Claims, 9 Drawing Sheets

(51) Int. Cl.
*H01L 51/00* (2006.01)
*H01L 27/32* (2006.01)
(52) U.S. Cl.
CPC .. *H01L 2227/323* (2013.01); *H01L 2227/326* (2013.01); *H01L 2251/5338* (2013.01); *H01L 2251/566* (2013.01)

FLEXIBLE OLED DISPLAY AND MANUFACTURING METHOD THEREOF

BACKGROUND OF THE INVENTION

1. Field of the Invention

The present invention relates to the field of display techniques, and in particular to a flexible OLED display and manufacturing method thereof.

2. The Related Arts

The organic light emitting diode (OLED) display, also called organic electroluminescent display, is the new trend of flat panel display technology. Because the OLED display provides the advantages of simple manufacturing process, low cost, low power-consumption, high illumination, wide operating temperature range, thin size, short response time, enabling full-color large display, easy to match integrated circuit (IC) driver, and enabling flexible display, the OLED is recognized as the technology with widest application prospect.

The driving types of OLED can be divided according to the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

In general, the structure of an OLED display comprises: a substrate, an anode disposed on the substrate, a hole inject layer (HIL) disposed on the anode, a hole transport layer (HTL) disposed on the HIL, a light-emitting layer disposed on the HTL, an electron transport layer (ETL) disposed on the light-emitting layer, an electron inject layer (EIL) disposed on the ETL, and a cathode disposed on the EIL. The light-emission principle of the OLED display is that the semiconductor material and the organic light-emitting material emit light through the carrier injection and compound driven by an electric field. Specifically, the OLED display usually uses ITO pixel electrode and metal electrode respectively for the anode and cathode. Under a specific voltage driving, the electrons and holes are injected into the ETL and HTL respectively from the cathode and anode. The electrons and the holes are migrated respectively to the light-emitting layer and encounter each other to form excitons and excite the light-emitting molecules, which emit visible lights through radiation relaxation.

Compared to TFT-LCD, the OLED provides the advantages of the ability to realize large-sized, ultra-thin, flexible and transparent displays. However, because the flexible substrate is prone to deform and is difficult to process during manufacturing, the production of flexible devices is still limited.

At present, the flexible OLED devices are mainly fabricated by adhering flexible substrates to rigid substrates. After the OLED devices are prepared on the flexible substrate, the rigid substrate is separated from the flexible substrate. However, since the rigid substrate and the flexible substrate are bonded tightly, the separation is difficult. The current laser lift-off method, although able to separate flexible substrate and rigid substrate, is complex and produces poor yield rate.

SUMMARY OF THE INVENTION

The object of the present invention is to provide a manufacturing method of flexible OLED display, able to solve the problem of separating the rigid substrate and flexible substrate when manufacturing flexible OLED display and to improve yield rate and production efficiency.

Another object of the present invention is to provide a flexible OLED display, which is easy to manufacture and provides high performance.

To achieve the above object, the present invention provides a manufacturing method of flexible OLED display, which comprises:

Step 1: providing a transfer template and forming a plurality of first polymeric film layers with intervals on the transfer template;

Step 2: providing a rigid substrate and forming a plurality of seals on the rigid substrate at locations corresponding respectively to the plurality of first polymeric film layers on the transfer template, with each seal positioned corresponding to the edge of each first polymeric film layer or within the edge;

Step 3: transferring the plurality of first polymeric film layers on the transfer template onto the rigid substrate, and the plurality of first polymeric film layers being adhered to the rigid substrate by the plurality of seals;

Step 4: applying a second polymeric film layer over the plurality of first polymeric film layers and the rigid substrate, the second polymeric film layer having an area larger than an area of the plurality of first polymer film layers;

Step 5: forming a plurality of thin film transistor (TFT) layers on the second polymeric film layer at locations corresponding respectively to the plurality of first polymeric film layers, and fabricating a plurality of OLED devices respectively on the plurality of TFT layers, the locations of the plurality of TFT layers and the plurality of OLED devices corresponding respectively to the inner sides of the plurality of seals;

Step 6: encapsulating the plurality of OLED devices and the plurality of TFT layers, forming a plurality of encapsulating structure layers on the second polymeric film layer and the plurality of OLED devices to cover the outer surfaces of the OLED devices and the plurality of TFT layers respectively to obtain a substrate ready for cutting;

Step 7: cutting the substrate ready for cutting along the inner side of the plurality of seals, separating the first polymeric film layer under the OLED device from the rigid substrate, thereby stripping off the rigid substrate to obtain a plurality of flexible OLED displays;

wherein the flexible OLED display comprising, from bottom to top, the first polymeric film layer, the second polymeric film layer, the TFT layer, the OLED device, and the encapsulating structure layer overlaying the second polymeric film layer and the OLED device and covering the outer surfaces of the OLED device and the TFT layer.

According to a preferred embodiment of the present invention, the material of the transfer template is polydimethylsiloxane.

According to a preferred embodiment of the present invention, the rigid substrate is a glass substrate or a stainless steel substrate.

According to a preferred embodiment of the present invention, the seal is a UV glue, and Step 3 further comprises a step of curing the seals by irradiating ultraviolet rays on the seals.

According to a preferred embodiment of the present invention, the first polymeric film layer and the second polymeric film layer are both polyimides.

According to a preferred embodiment of the present invention, in Step 5, the plurality of OLED devices is formed by vapor deposition or solution processing.

According to a preferred embodiment of the present invention, in Step 6, the plurality of OLED devices and the plurality of TFT layers are encapsulated by a thin film encapsulation technique.

According to a preferred embodiment of the present invention, in Step 7, the substrate ready for cutting is cut by laser dicing.

Another embodiment of the present invention provides a flexible OLED display, which comprises, from bottom to top, a first polymeric film layer, a second polymeric film layer, a TFT layer, an OLED device, and an encapsulating structure layer overlaying the second polymeric film layer and the OLED device and covering the outer surfaces of the OLED device and the TFT layer.

According to a preferred embodiment of the present invention, the first polymeric film layer and the second polymeric film layer are both polyimides.

Yet another embodiment of the present invention provides a manufacturing method of flexible OLED display, which comprises:

Step 1: providing a transfer template and forming a plurality of first polymeric film layers with intervals on the transfer template;

Step 2: providing a rigid substrate and forming a plurality of seals on the rigid substrate at locations corresponding respectively to the plurality of first polymeric film layers on the transfer template, with each seal positioned corresponding to the edge of each first polymeric film layer or within the edge;

Step 3: transferring the plurality of first polymeric film layers on the transfer template onto the rigid substrate, and the plurality of first polymeric film layers being adhered to the rigid substrate by the plurality of seals;

Step 4: applying a second polymeric film layer over the plurality of first polymeric film layers and the rigid substrate, the second polymeric film layer having an area larger than an area of the plurality of first polymer film layers;

Step 5: forming a plurality of thin film transistor (TFT) layers on the second polymeric film layer at locations corresponding respectively to the plurality of first polymeric film layers, and fabricating a plurality of OLED devices respectively on the plurality of TFT layers, the locations of the plurality of TFT layers and the plurality of OLED devices corresponding respectively to the inner sides of the plurality of seals;

Step 6: encapsulating the plurality of OLED devices and the plurality of TFT layers, forming a plurality of encapsulating structure layers on the second polymeric film layer and the plurality of OLED devices to cover the outer surfaces of the OLED devices and the plurality of TFT layers respectively to obtain a substrate ready for cutting;

Step 7: cutting the substrate ready for cutting along the inner side of the plurality of seals, separating the first polymeric film layer under the OLED device from the rigid substrate, thereby stripping off the rigid substrate to obtain a plurality of flexible OLED displays;

wherein the flexible OLED display comprising, from bottom to top, the first polymeric film layer, the second polymeric film layer, the TFT layer, the OLED device, and the encapsulating structure layer overlaying the second polymeric film layer and the OLED device and covering the outer surfaces of the OLED device and the TFT layer;

wherein the material of the transfer template being polydimethylsiloxane;

wherein the rigid substrate being a glass substrate or a stainless steel substrate;

wherein the first polymeric film layer and the second polymeric film layer being both polyimides.

Compared to the known techniques, the present invention provides the following advantages. The present invention provides a manufacturing method of flexible OLED display, by using transferring to adhere a plurality of first polymeric film layers onto a rigid substrate coated with a plurality of seals, and then coating a second polymeric film layer on the plurality of first polymeric film layers and the rigid substrate, forming a plurality of TFT layers and a plurality of OLED devices on the second polymeric film layer corresponding to the inner sides of the plurality of seals, followed by encapsulating, cutting along the inner sides of the seals to obtain a plurality of flexible OLED displays, which effectively solves the problem of separating rigid substrate and flexible substrate when manufacturing flexible OLED display, and greatly improve the production efficiency and yield rate. The invention provides a flexible OLED display, which is easy to manufacture and has high yield rate.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
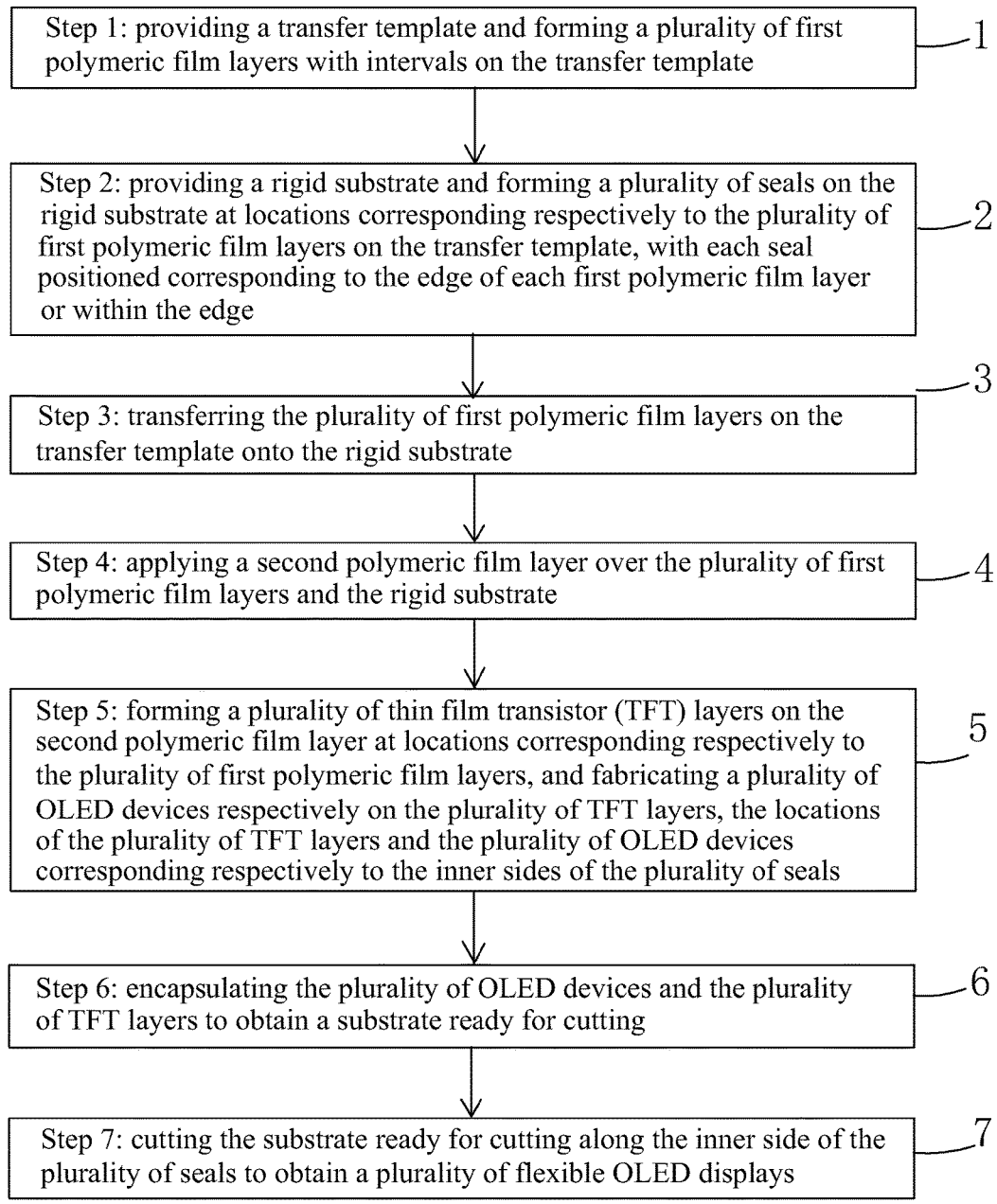
FIG. 1 is a schematic view showing the flowchart of the manufacturing method of flexible OLED display provided by an embodiment of the present invention.
Figure 2:
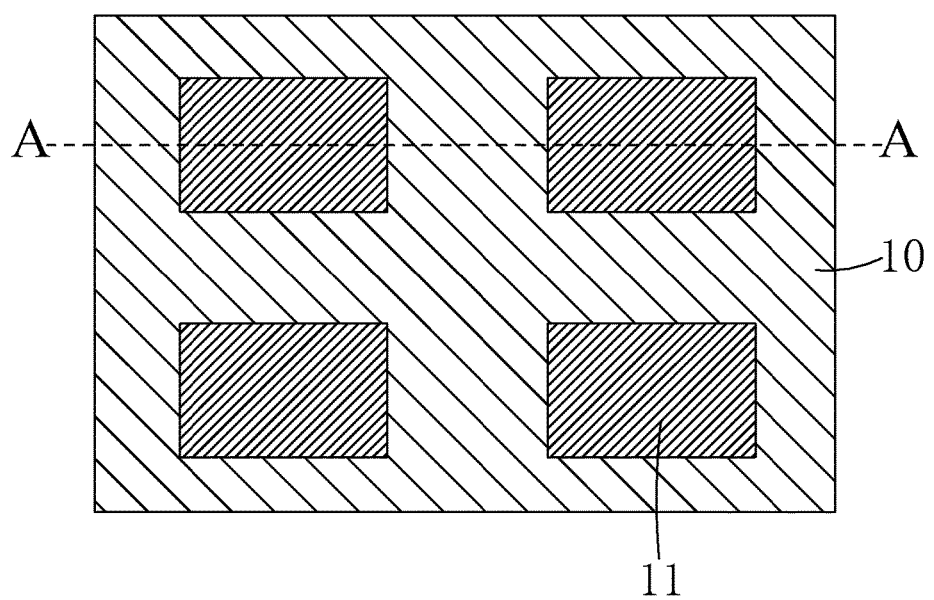
FIG. 2 is a schematic view showing Step 1 of the manufacturing method of flexible OLED display provided by an embodiment of the present invention.
Figure 3:
FIG. 3 is a schematic view showing the cross-section of AA of FIG. 2.

Referring to FIG. 1, the present invention provides a manufacturing method of flexible OLED display, which comprises the following steps:

Step 1: as shown in FIG. 2 and FIG. 3, providing a transfer template 10 and forming a plurality of first polymeric film layers 11 with intervals on the transfer template 10.

Specifically, the term "a plurality of" comprises one and more than one.

Specifically, the material of the transfer template 10 is polydimethylsiloxane (PDMS).

Figure 4:
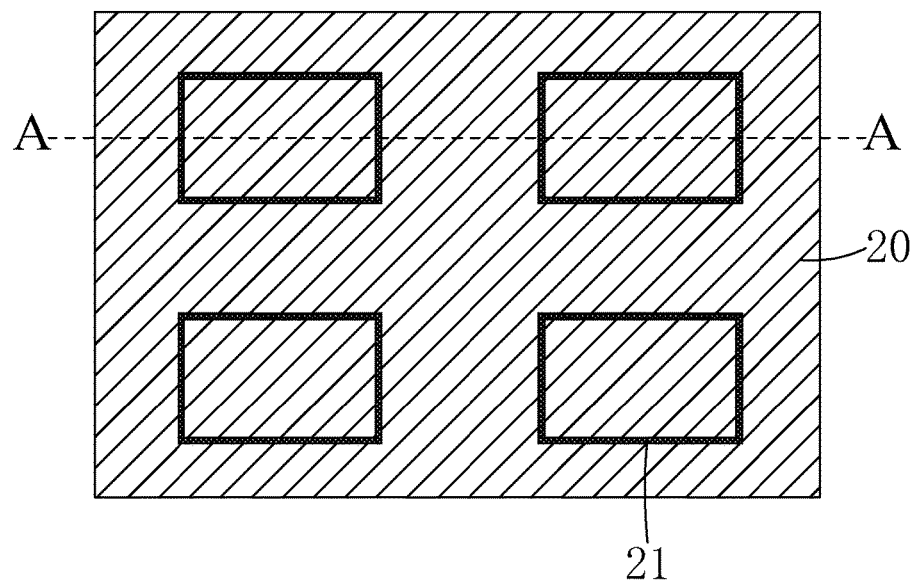
FIG. 4 is a schematic view showing Step 2 of the manufacturing method of flexible OLED display provided by an embodiment of the present invention.
Figure 5:
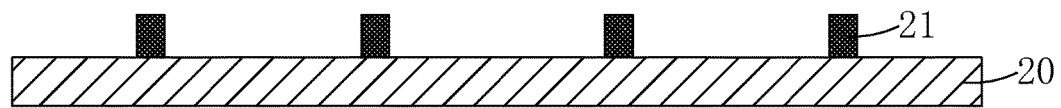
FIG. 5 is a schematic view showing the cross-section of AA of FIG. 4.

Step 2: as shown in FIG. 4 and FIG. 5, providing a rigid substrate 20 and forming a plurality of seals 21 on the rigid substrate 20 at locations corresponding respectively to the plurality of first polymeric film layers 11 on the transfer template 10, with each seal 21 positioned corresponding to the edge of each first polymeric film layer 11 or within the edge.

Preferably, the rigid substrate 20 is a glass substrate or a stainless steel substrate.

Figure 6:
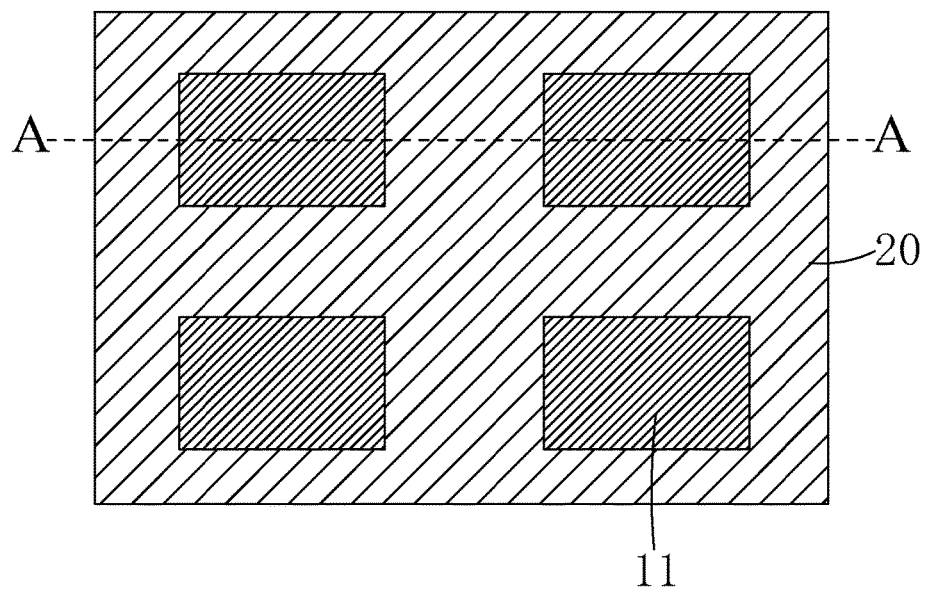
FIG. 6 is a schematic view showing Step 3 of the manufacturing method of flexible OLED display provided by an embodiment of the present invention.
Figure 7:
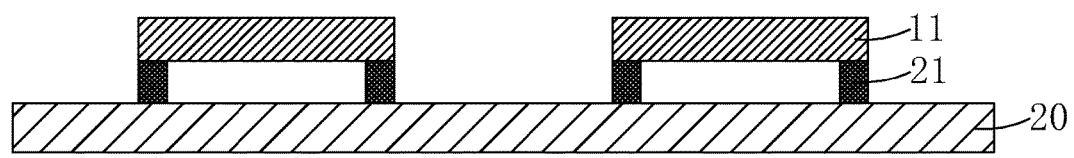
FIG. 7 is a schematic view showing the cross-section of AA of FIG. 6.

Step 3: as shown in FIG. 6 and FIG. 7, transferring the plurality of first polymeric film layers 11 on the transfer template 10 onto the rigid substrate 20, and the plurality of first polymeric film layers 11 being adhered to the rigid substrate 20 by the plurality of seals 21.

Preferably, the seal 21 is a UV glue, and Step 3 further comprises a step of curing the seals 21 by irradiating ultraviolet rays on the seals 21.

Figure 8:
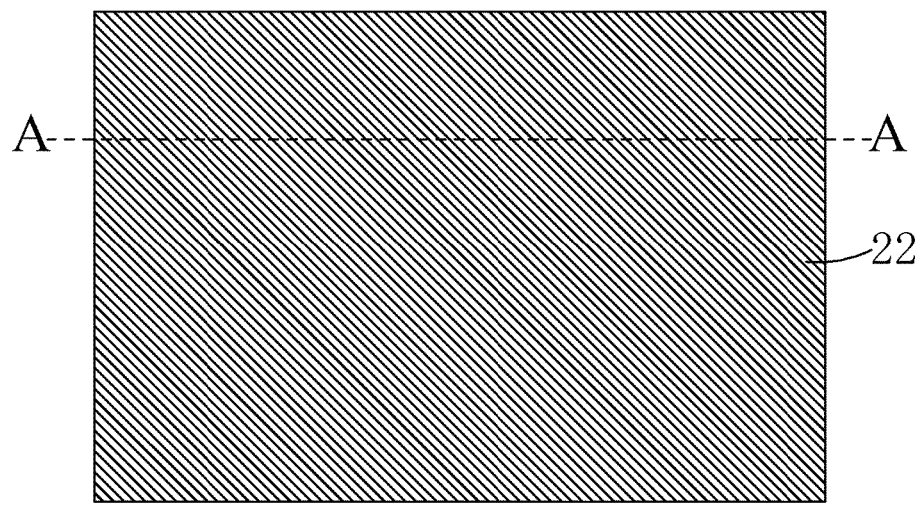
FIG. 8 is a schematic view showing Step 4 of the manufacturing method of flexible OLED display provided by an embodiment of the present invention.
Figure 9:
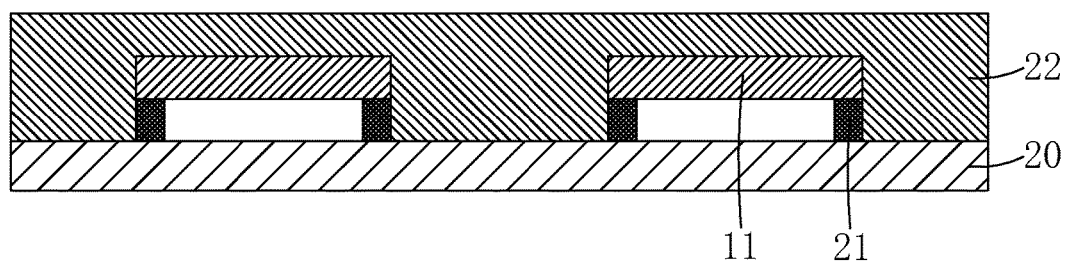
FIG. 9 is a schematic view showing the cross-section of AA of FIG. 8.

Step 4: as shown in FIG. 8 and FIG. 9, applying a second polymeric film layer 22 over the plurality of first polymeric film layers 11 and the rigid substrate 20, the second polymeric film layer 22 having an area larger than an area of the plurality of first polymer film layers 11.

Preferably, the second polymeric film layer 22 obtained in Step 4 has a smooth upper surface so as to facilitate the formation and encapsulation of the TFT layers 23 and the OLED devices 24 in subsequent steps.

Preferably, the first polymeric film layer 11 and the second polymeric film layer 22 are both polyimides (PI).

Figure 10:
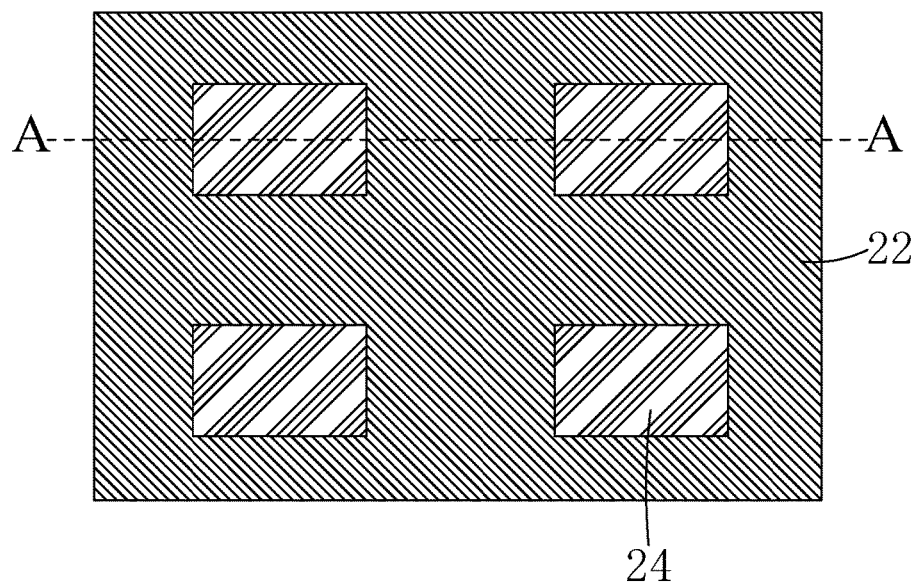
FIG. 10 is a schematic view showing Step 5 of the manufacturing method of flexible OLED display provided by an embodiment of the present invention.
Figure 11:
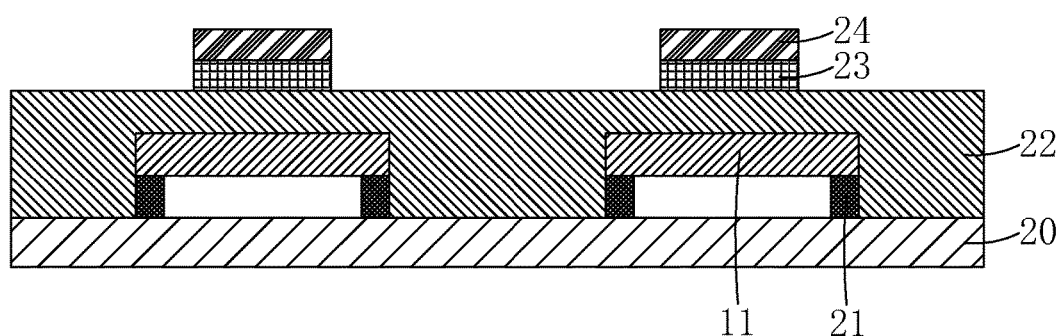
FIG. 11 is a schematic view showing the cross-section of AA of FIG. 10.

Step 5: as shown in FIG. 10 and FIG. 11, forming a plurality of thin film transistor (TFT) layers 23 on the second polymeric film layer 22 at locations corresponding respectively to the plurality of first polymeric film layers 11, and fabricating a plurality of OLED devices 24 respectively on the plurality of TFT layers 23, the locations of the plurality of TFT layers 23 and the plurality of OLED devices 24 corresponding respectively to the inner sides of the plurality of seals 21.

Specifically, in Step 5, the plurality of OLED devices 24 is formed by vapor deposition or solution processing.

Figure 12:
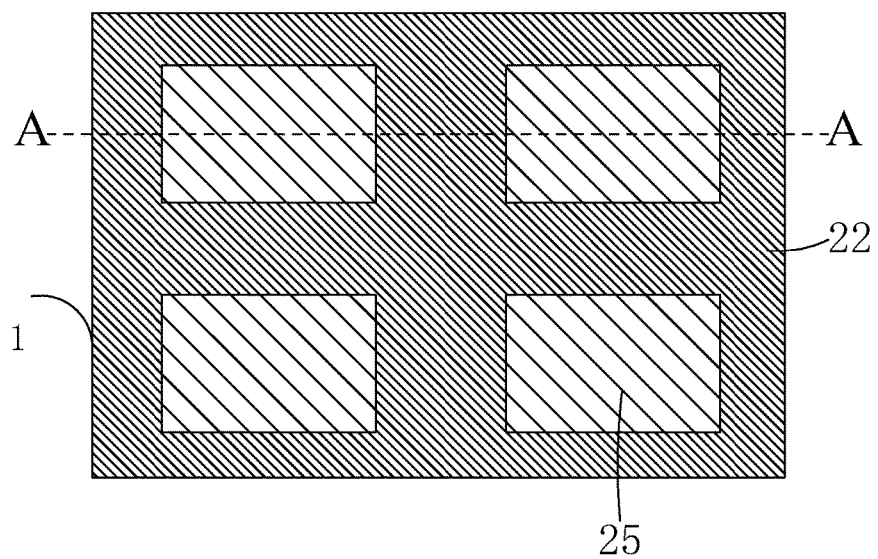
FIG. 12 is a schematic view showing Step 6 of the manufacturing method of flexible OLED display provided by an embodiment of the present invention.
Figure 13:
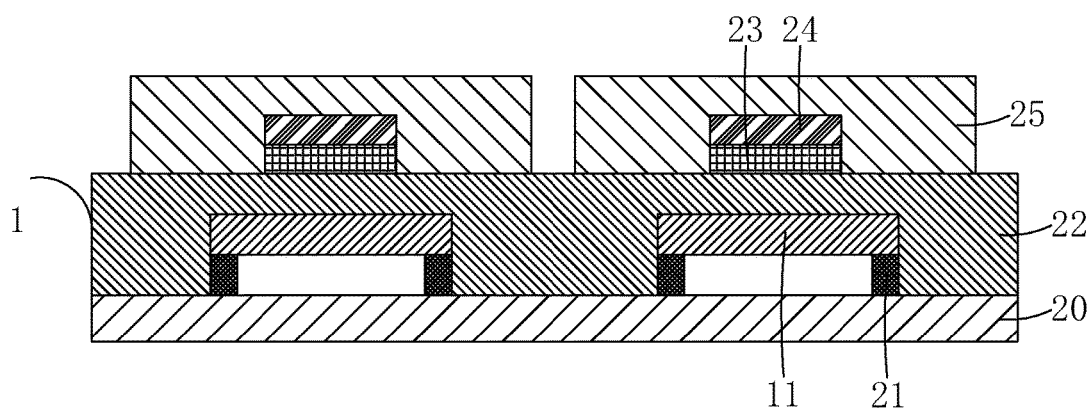
FIG. 13 is a schematic view showing the cross-section of AA of FIG. 12.
Figure 14:
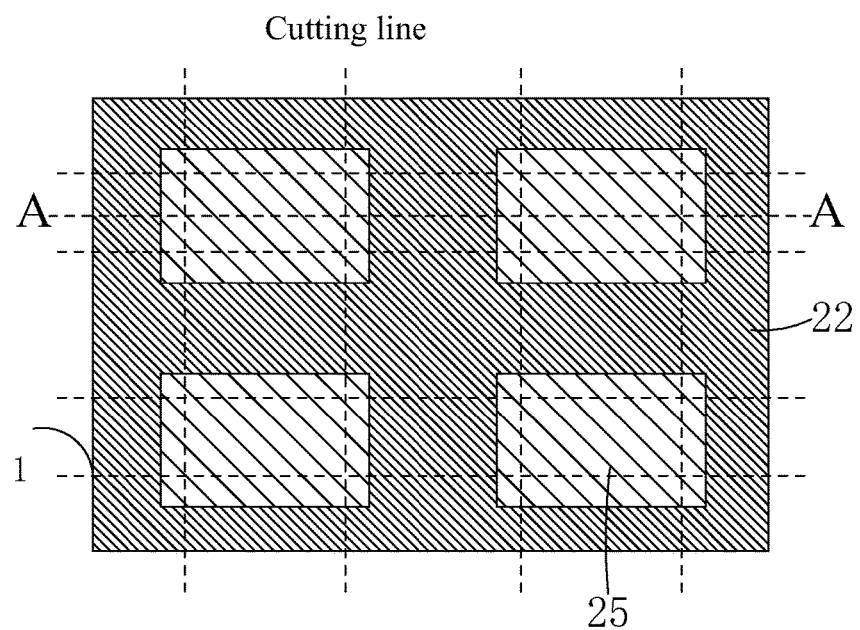
FIG. 14 and FIG. 16 are schematic views showing Step 7 of the manufacturing method of flexible OLED display provided by an embodiment of the present invention.
Figure 15:
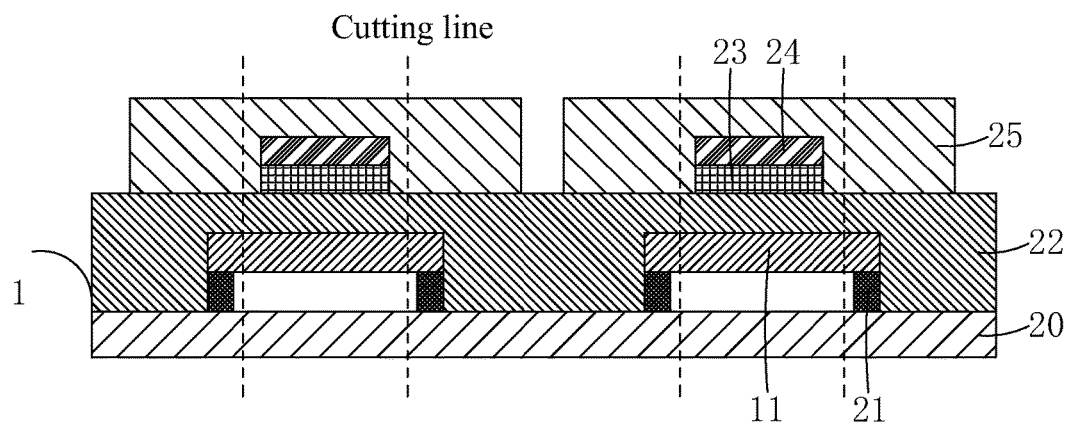
FIG. 15 is a schematic view showing the cross-section of AA of FIG. 14.
Figure 16:
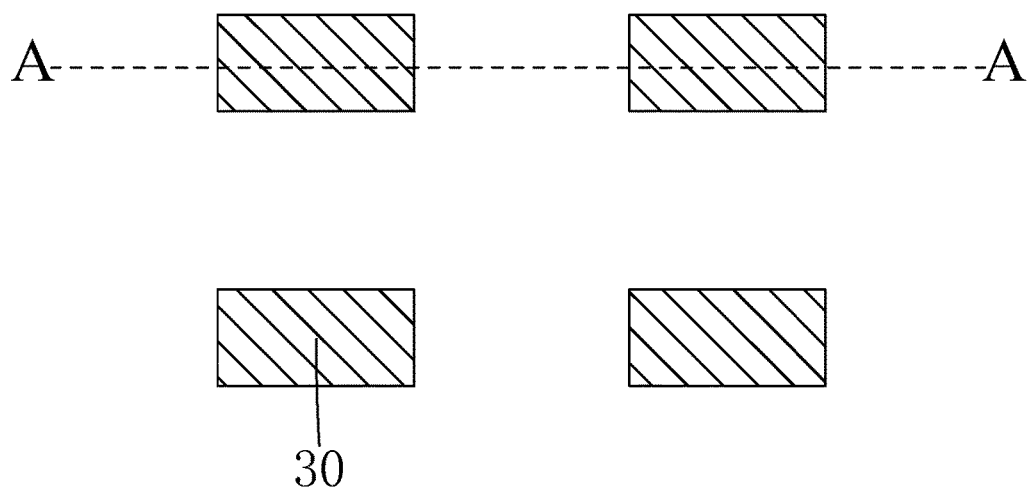
Figure 17:
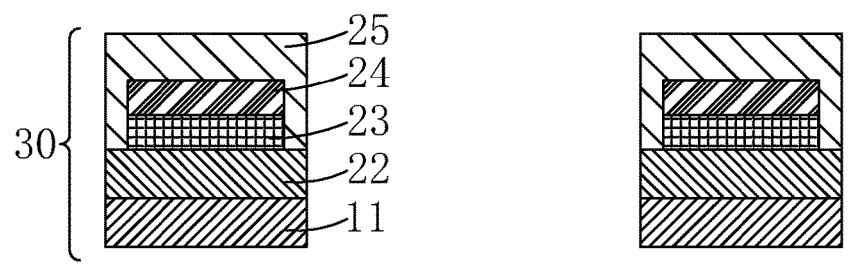
FIG. 17 is a schematic view showing the cross-section of AA of FIG. 16 and the structure of the flexible OLED display provided by an embodiment of the present invention.

Step 6: as shown in FIG. 12 and FIG. 13, encapsulating the plurality of OLED devices 24 and the plurality of TFT layers 23, forming a plurality of encapsulating structure layers 25 on the second polymeric film layer 22 and the plurality of OLED devices 24 to cover the outer surfaces of the OLED devices 24 and the plurality of TFT layers 23 respectively to obtain a substrate 1 ready for cutting.

Preferably, in Step 6, the plurality of OLED devices 24 and the plurality of TFT layers 23 are encapsulated by a thin film encapsulation (TFE) technique.

Step 7: as shown in FIGS. 14-17, cutting the substrate 1 ready for cutting along the inner side of the plurality of seals 21, separating the first polymeric film layer 11 under the OLED device 24 from the rigid substrate 20, thereby stripping off the rigid substrate 20 to obtain a plurality of flexible OLED displays 30.

Wherein the flexible OLED display 30 comprises, from bottom to top, the first polymeric film layer 11, the second polymeric film layer 22, the TFT layer 23, the OLED device 24, and the encapsulating structure layer 25 overlaying the second polymeric film layer 22 and the OLED device 24, and covering the outer surfaces of the OLED device 24 and the TFT layer 23.

Specifically, in Step 7, the substrate 1 ready for cutting is cut by laser dicing.

The aforementioned manufacturing method of flexible OLED display uses transferring to adhere a plurality of first polymeric film layers 11 onto a rigid substrate 20 coated with a plurality of seals 21, and then coats a second polymeric film layer 22 on the plurality of first polymeric film layers 11 and the rigid substrate 20, forms a plurality of TFT layers 23 and a plurality of OLED devices 24 on the second polymeric film layer 22 corresponding to the inner sides of the plurality of seals 21, encapsulates, and cuts along the inner sides of the seals 21 to obtain a plurality of flexible OLED displays 30, which effectively solves the problem of separating rigid substrate and flexible substrate when manufacturing flexible OLED display, and greatly improve the production efficiency and yield rate.

Referring FIG. 7, based on the aforementioned manufacturing method, the present invention also provides a flexible OLED display 30, which comprises, from bottom to top, a first polymeric film layer 11, a second polymeric film layer 22, a TFT layer 23, an OLED device 24, and an encapsulating structure layer 25 overlaying the second polymeric film layer 22 and the OLED device 24, and covering the outer surfaces of the OLED device 24 and the TFT layer 23.

Preferably, the first polymeric film layer 11 and the second polymeric film layer 22 are both polyimides (PI).

The aforementioned flexible OLED display is easy to manufacture and has high yield rate.

In summary, the present invention provides a flexible OLED display and manufacturing method thereof. The present invention provides a manufacturing method of flexible OLED display, by using transferring to adhere a plurality of first polymeric film layers onto a rigid substrate coated with a plurality of seals, and then coating a second polymeric film layer on the plurality of first polymeric film layers and the rigid substrate, forming a plurality of TFT layers and a plurality of OLED devices on the second polymeric film layer corresponding to the inner sides of the plurality of seals, followed by encapsulating, cutting along the inner sides of the seals to obtain a plurality of flexible OLED displays, which effectively solves the problem of separating rigid substrate and flexible substrate when manufacturing flexible OLED display, and greatly improve the production efficiency and yield rate. The invention provides a flexible OLED display, which is easy to manufacture and has high yield rate.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of flexible organic light-emitting diode (OLED) display, which comprises:
   Step 1: providing a transfer template and forming a plurality of first polymeric film layers with intervals on the transfer template;
   Step 2: providing a rigid substrate and forming a plurality of seals on the rigid substrate at locations corresponding respectively to the plurality of first polymeric film layers on the transfer template, with each seal positioned corresponding to the edge of each first polymeric film layer or within the edge;
   Step 3: transferring the plurality of first polymeric film layers on the transfer template onto the rigid substrate, and the plurality of first polymeric film layers being adhered to the rigid substrate by the plurality of seals;
   Step 4: applying a second polymeric film layer over the plurality of first polymeric film layers and the rigid substrate, the second polymeric film layer having an area larger than an area of the plurality of first polymer film layers;
   Step 5: forming a plurality of thin film transistor (TFT) layers on the second polymeric film layer at locations corresponding respectively to the plurality of first polymeric film layers, and fabricating a plurality of OLED devices respectively on the plurality of TFT layers, the locations of the plurality of TFT layers and the plurality of OLED devices corresponding respectively to the inner sides of the plurality of seals;
   Step 6: encapsulating the plurality of OLED devices and the plurality of TFT layers, forming a plurality of encapsulating structure layers on the second polymeric film layer and the plurality of OLED devices to cover the outer surfaces of the OLED devices and the plurality of TFT layers respectively to obtain a substrate ready for cutting;
   Step 7: cutting the substrate ready for cutting along the inner side of the plurality of seals, separating the first polymeric film layer under the OLED device from the rigid substrate, thereby stripping off the rigid substrate to obtain a plurality of flexible OLED displays;
   wherein the flexible OLED display comprising, from bottom to top, the first polymeric film layer, the second polymeric film layer, the TFT layer, the OLED device, and the encapsulating structure layer overlaying the second polymeric film layer and the OLED device and covering the outer surfaces of the OLED device and the TFT layer.

2. The manufacturing method of flexible OLED display as claimed in claim 1, wherein the material of the transfer template is polydimethylsiloxane.

3. The manufacturing method of flexible OLED display as claimed in claim 1, wherein the rigid substrate is a glass substrate or a stainless steel substrate.

4. The manufacturing method of flexible OLED display as claimed in claim 1, wherein the seal is a UV glue, and Step 3 further comprises a step of curing the seals by irradiating ultraviolet rays on the seals.

5. The manufacturing method of flexible OLED display as claimed in claim 1, wherein the first polymeric film layer and the second polymeric film layer are both polyimides.

6. The manufacturing method of flexible OLED display as claimed in claim 1, wherein in Step 5, the plurality of OLED devices is formed by vapor deposition or solution processing.

7. The manufacturing method of flexible OLED display as claimed in claim 1, wherein in Step 6, the plurality of OLED devices and the plurality of TFT layers are encapsulated by a thin film encapsulation technique.

8. The manufacturing method of flexible OLED display as claimed in claim 1, wherein in Step 7, the substrate ready for cutting is cut by laser dicing.

9. A manufacturing method of flexible organic light-emitting diode (OLED) display, which comprises:
   Step 1: providing a transfer template and forming a plurality of first polymeric film layers with intervals on the transfer template;
   Step 2: providing a rigid substrate and forming a plurality of seals on the rigid substrate at locations corresponding respectively to the plurality of first polymeric film layers on the transfer template, with each seal positioned corresponding to the edge of each first polymeric film layer or within the edge;
   Step 3: transferring the plurality of first polymeric film layers on the transfer template onto the rigid substrate, and the plurality of first polymeric film layers being adhered to the rigid substrate by the plurality of seals;
   Step 4: applying a second polymeric film layer over the plurality of first polymeric film layers and the rigid substrate, the second polymeric film layer having an area larger than an area of the plurality of first polymer film layers;
   Step 5: forming a plurality of thin film transistor (TFT) layers on the second polymeric film layer at locations corresponding respectively to the plurality of first polymeric film layers, and fabricating a plurality of OLED devices respectively on the plurality of TFT layers, the locations of the plurality of TFT layers and the plurality of OLED devices corresponding respectively to the inner sides of the plurality of seals;
   Step 6: encapsulating the plurality of OLED devices and the plurality of TFT layers, forming a plurality of encapsulating structure layers on the second polymeric film layer and the plurality of OLED devices to cover the outer surfaces of the OLED devices and the plurality of TFT layers respectively to obtain a substrate ready for cutting;
   Step 7: cutting the substrate ready for cutting along the inner side of the plurality of seals, separating the first polymeric film layer under the OLED device from the rigid substrate, thereby stripping off the rigid substrate to obtain a plurality of flexible OLED displays;
   wherein the flexible OLED display comprising, from bottom to top, the first polymeric film layer, the second polymeric film layer, the TFT layer, the OLED device, and the encapsulating structure layer overlaying the second polymeric film layer and the OLED device and covering the outer surfaces of the OLED device and the TFT layer;
   wherein the material of the transfer template is polydimethylsiloxane;

wherein the rigid substrate is a glass substrate or a stainless steel substrate;

wherein the first polymeric film layer and the second polymeric film layer are both polyimides.

10. The manufacturing method of flexible OLED display as claimed in claim 9, wherein the seal is a UV glue, and Step 3 further comprises a step of curing the seals by irradiating ultraviolet rays on the seals.

11. The manufacturing method of flexible OLED display as claimed in claim 9, wherein in Step 5, the plurality of OLED devices is formed by vapor deposition or solution processing.

12. The manufacturing method of flexible OLED display as claimed in claim 9, wherein in Step 6, the plurality of OLED devices and the plurality of TFT layers are encapsulated by a thin film encapsulation technique.

13. The manufacturing method of flexible OLED display as claimed in claim 9, wherein in Step 7, the substrate ready for cutting is cut by laser dicing.

* * * * *